United States Patent
Finkenzeller et al.

(10) Patent No.: US 9,906,247 B2
(45) Date of Patent: Feb. 27, 2018

(54) METHOD AND SECURITY MODULE FOR ADAPTATION OF A REFERENCE VALUE FOR GENERATION OF A BIT STREAM

(71) Applicant: GIESECKE & DEVRIENT GMBH, München (DE)

(72) Inventors: Klaus Finkenzeller, Unterföhring (DE); Florian Pfeiffer, Grafing bein München (DE)

(73) Assignee: GIESECKE+DEVRIENT MOBILE SECURITY GMBH, Munich (DE)

( * ) Notice: Subject to any disclaimer, the term of this patent is extended or adjusted under 35 U.S.C. 154(b) by 0 days.

(21) Appl. No.: 15/514,199

(22) PCT Filed: Sep. 22, 2015

(86) PCT No.: PCT/EP2015/001883
§ 371 (c)(1),
(2) Date: Mar. 24, 2017

(87) PCT Pub. No.: WO2016/045789
PCT Pub. Date: Mar. 31, 2016

(65) Prior Publication Data
US 2017/0302313 A1    Oct. 19, 2017

(30) Foreign Application Priority Data
Sep. 26, 2014   (DE) .................. 10 2014 014 449

(51) Int. Cl.
*H04B 1/08*      (2006.01)
*H04B 1/10*      (2006.01)
(Continued)

(52) U.S. Cl.
CPC .............. *H04B 1/109* (2013.01); *H04B 1/22* (2013.01); *H04L 27/14* (2013.01); *G06K 19/073* (2013.01); *G06K 19/0723* (2013.01)

(58) Field of Classification Search
None
See application file for complete search history.

(56) References Cited

U.S. PATENT DOCUMENTS 4,969,207 A * 11/1990 Sakamoto .............. H03G 3/345
                                                        455/134
5,321,851 A *  6/1994 Sugayama ............. H03J 7/285
                                                        455/161.3
(Continued)

FOREIGN PATENT DOCUMENTS

JP     2006050311 A     2/2006

OTHER PUBLICATIONS

German Search Report for the corresponding German Application No. 102014014449.6, dated May 20, 2015.
(Continued)

*Primary Examiner* — Lana N Le
(74) *Attorney, Agent, or Firm* — Workman Nydegger (57) ABSTRACT

A method and a circuit are arranged for adapting a first reference value for generating a first bit stream from an input signal by a first amplitude adapting unit. The input signal comprises a first and a second signal. The first signal and the second signal form a baseband sum signal. A first non-linear component demodulates the input signal and outputs a demodulated input signal. The amplitude adapting unit outputs the first bit stream from the demodulated input signal on the basis of a first reference value. A reference-value adapting unit comprises a detection unit which detects the first and the second signal. Upon discontinuation of the first and second signals, an adjusting unit adjusts the first reference value to a basic reference value.

16 Claims, 7 Drawing Sheets

(51) Int. Cl.
*H04B 1/22* (2006.01)
*H04L 27/14* (2006.01)
*G06K 19/07* (2006.01)
*G06K 19/073* (2006.01)

(56) References Cited

U.S. PATENT DOCUMENTS

| | | | | |
|---|---|---|---|---|
| 5,424,738 A * | 6/1995 | Barroue | ............ | H03M 1/0607 341/118 |
| 7,055,380 B2 * | 6/2006 | Ibuka | ............ | B60C 23/0408 331/17 |
| 7,570,933 B2 * | 8/2009 | Taipale | ............ | H04L 27/08 455/232.1 |
| 8,233,093 B2 * | 7/2012 | Wu | ............ | H04N 5/52 348/471 |
| 8,644,776 B1 * | 2/2014 | Nobbe | ............ | H03C 1/62 455/115.1 |
| 9,037,103 B2 * | 5/2015 | Kroeger | ............ | H04B 7/0845 375/267 |
| 9,042,943 B2 * | 5/2015 | Sawada | ............ | H04M 1/72522 455/566 |
| 2009/0023409 A1 | 1/2009 | Kato et al. | | |
| 2011/0267976 A1 * | 11/2011 | Oodachi | ............ | H04B 7/1555 370/252 |
| 2013/0079060 A1 * | 3/2013 | Pivit | ............ | H01Q 3/267 455/561 |
| 2013/0314103 A1 * | 11/2013 | Nakagawa | ............ | H04B 3/46 324/613 |
| 2013/0321190 A1 | 12/2013 | Lesso et al. | | |

OTHER PUBLICATIONS

International Preliminary Report on Patentability for the corresponding International PCT Application No. PCT/EP2015/001883, dated Mar. 28, 2017.

International Search Report for the corresponding International PCT Application No. PCT/EP2015/001883, dated Dec. 14, 2015.

* cited by examiner

Fig. 6 ion the invention for adapting a first
METHOD AND SECURITY MODULE FOR ADAPTATION OF A REFERENCE VALUE FOR GENERATION OF A BIT STREAM

BACKGROUND

The present invention relates to a method and a circuit according to the preamble of the independent claims.

In particular the present invention relates to a method for adapting a first reference value. The first reference value serves for generating a first bit stream from an input signal by an amplitude adapting unit. The input signal comprises a first signal and a second signal. The first signal has a first signal amplitude and the second signal a second signal amplitude. The first signal amplitude and the second signal amplitude form a mixed amplitude. A first non-linear component demodulates the input signal and outputs the demodulated input signal as a mixed signal. On the basis of the first reference value, the amplitude adapting unit outputs a first bit stream from the mixed signal or the demodulated input signal.

Further, the present invention relates to in particular a circuit for adapting a first reference value for generating a first bit stream from an input signal. The input signal comprises a first signal and a second signal, wherein the first signal has a first signal amplitude and the second signal a second signal amplitude. The first signal amplitude forms a mixed amplitude with the second signal amplitude. The circuit has a first non-linear component and a first amplitude adapting unit. The first non-linear component is configured to demodulate the input signal and to output a demodulated input signal. The first amplitude adapting unit is configured to generate the first bit stream from the demodulated input signal on the basis of the first reference value.

Various methods are known for receiving input signals and demodulating signals, in particular by a contactless security module. A receiving unit receives a first signal from a transmitting/receiving device. The received first signal is usually modified by way of an impedance transducer, in particular an apparatus and/or unit for multiplying a voltage. With the impedance transducer, an amplitude, in particular a voltage amplitude, of the received first signal is increased. If the first signal is an amplitude-modulated signal, the first signal is demodulated with the help of the impedance transducer, which comprises at least one non-linear component. The impedance transducer is usually a voltage multiplier.

For generating an output bit stream from the first signal, it is processed by means of an amplitude adapting unit. The amplitude adapting unit creates a bit stream of the first signal from the modified first signal. The amplitude adapting unit usually comprises a comparator with which the demodulated first signal is converted into a binary signal. The demodulated first signal is furthermore smoothed in a second current path by means of a smoothing unit and therefrom a reference value is formed for the comparator. The reference value, which is preferably smaller than the peak amplitude of the demodulated first signal at the input of the amplitude adapting unit, holds as a reference value relative to the demodulated first signal for generating a first output bit stream.

Due to a steady rise of wireless communication, the number of the signals which are modulated on different carrier frequencies is rising. Besides the first signal, the contactless security module often receives further signals, at least one second signal. Particularly if the second signal has a second carrier frequency, which lies close to the first carrier frequency of the first signal and the first carrier frequency and the second carrier frequency are therefore in the identical reception range of the security module, and moreover the second signal has an amplitude approximately of the order of magnitude of the first signal, the two carrier frequencies of the first signal and the second signal influence each other such that the security module cannot generate from the input signal an unambiguous output bit stream relating to the first signal. As a rule, only an interference value is generated. A communication between transmission/receiving device and the contactless security module is no longer ensured.

For example, the frequency ranges of GSM and UHF-RFID not only lie in immediate adjacency, but they partly overlap. For example, a UHF-RFID reading device transmits in the frequency range of 865 MHz and a GSM mobile phone in the frequency range of 880-915 MHz. Due to a simple design, a UHF-RFID transponder is ready to receive on a broad band. The reception range of the UHF-RFID transponder is usually limited only by the antenna. The UHF-RFID transponder can therefore receive UHF-RFID signals as well as GSM signals of a mobile phone in the vicinity. The two signals superimpose each other. The UHF-RFID transponder of the prior art cannot separate and decode the UHF-RFID signals. A communication between the UHF-RFID transponder and a UHF-RFID transmitting/receiving device is not possible as soon as the amplitude of the GSM signal exceeds a limit amplitude in proportion to the UHF-RFID signal.

SUMMARY

The object of the invention is to remedy the disadvantages of the prior art. In particular it is an object to provide an improved reception of a security module through which a communication is possible between a transmitting/receiving device and the security module when receiving at least one second signal in the identical reception range as the first signal.

In a method according to the invention for adapting a first reference value for generating a first bit stream from an input signal which comprises a first and a second signal. A first non-linear component demodulates the input signal and outputs a demodulated input signal. Further, the first non-linear component outputs a baseband sum signal. An amplitude adapting unit outputs the first bit stream from the demodulated input signal on the basis of the first reference value. According to the invention, a detection unit detects the first and second signal. Upon discontinuation of the first and second signals, a reference-value adapting unit effectuates an adjusting of the first reference value, in particular its amplitude, to a basic reference value.

The baseband sum signal is substantially the sum of the envelopes of the amount of the high-frequency first and second signals or of the input signal. The sum amplitude is higher than the signal amplitude of the first or second signal. Preferably the first signal is an amplitude-modulated signal, for example an UHF-RFID signal, and the second signal not an amplitude-modulated signal, for example a GMSK-modulated signal. Upon the discontinuation of the first and/or second signal, it is an undershooting of a minimum amplitude. It is therefore to be understood as a valley traversal. The discontinuation of the first and second signal does not necessarily take place simultaneously. In particular, the first and second signal can drop differently in time. The discontinuation of the first and second signal therefore describes a state in which a 0-level or a low-signal is simultaneously present in the amplitude course of the first signal as well as in the amplitude course of the second signal.

A circuit according to the invention for adapting a first reference value for generating a first bit stream from an input signal comprises a first non-linear component and a first amplitude adapting unit. The input signal comprises a first signal and a second signal. The first signal has a first signal amplitude and the second signal a second signal amplitude. The first signal amplitude forms a mixed amplitude with the second signal amplitude. The first non-linear component is configured to demodulate the input signal and to output a demodulated input signal. The first amplitude adapting unit is configured to generate the first bit stream from the demodulated input signal on the basis of a first reference value. According to the invention the circuit comprises a detection unit and an adjusting unit. The detection unit is configured to ascertain whether the first signal and/or the second signal is present in the input signal. The adjusting unit is configured to adapt the first reference value to a basic reference value if the second signal discontinues.

The reception of merely one signal cannot always be guaranteed. It can happen that at least two signals are present in the input signal. If one of the at least two signals discontinues, in particular the second signal, it is guaranteed by the invention that in this case the first bit stream is generated according to the signal course of the first signal. In particular a fast adapting of the first reference value to changed conditions in the input signal is enabled with the help of the adjusting unit, wherein the quality of the first reference value is preserved, e.g. as a direct-current voltage signal.

The method according to the invention and the circuit according to the invention preferably find application in a security module. In principle the security module can be embodied in a portable data carrier, hereinafter also called tag, such as a chip card, a secure mass memory card or a USB token. For example the security module can be an identity card and/or a transport ticket. The security module can have the form of a label. It can also be firmly incorporated in a module or body, like a Trusted Platform Module (TPM), an M2M module, a user identification module or a decoder module. The security module can be provided for the integration in a notebook computer, mobile phone, computer or keyboard. Preferably the security module has a processor and a memory. The security module is configured in particular for communicating via an over-the-air interface, e.g. in a frequency range of RFID, in particular UHF-RFID. The security module can be configured as a UHF-RFID module, preferably as a UHF-RFID transponder. The security module can be a part of a UHF-RFID tag or a UHF-RFID label.

The first and/or second signal is sent by a transmitting/receiving device. A transmitting/receiving device, hereinafter also called transmitter, serves for communicating with the security module. The transmitting/receiving device can be held available as a card reader, in particular a mobile unit, for example as accessories to a cash register system, to a computer or to a mobile phone, as a firmly installed device, in particular for access control, or as an integrated system in a notebook, mobile phone, computer or keyboard.

A non-linear component is an electrical and/or electronic component with a non-linear relation between current and voltage. Correspondingly a current-voltage characteristic is non-linear. A non-linear component can be merely a single component or a non-linear network. The non-linear network comprises components whose interconnection results in a non-linear current-voltage characteristic. A non-linear component can be a rectifier diode, a collector-emitter transition of a transistor or a tube. A non-linear network can be an interconnection of rectifier diodes. For example, a voltage multiplier with a diode circuit or a charge pump is a non-linear network.

The present invention now makes it possible, among other things, to operate a mobile telephone while using GSM services in the vicinity of a UHF-RFID transponder without influencing, in particular disturbing, the communication between UHF-RFID transmitting/receiving device and the UHF-RFID transponder. Therefore the UHF-RFID transponder cannot be negatively affected, in particular disturbed, in its communication by GSM signals.

In one embodiment it can be provided that the adjusting unit adjusts the first reference value according to the course of the sum amplitude. In particular for a varying signal amplitude of the first and/or second signal, for example with different reception quality of the first and/or second signal, the sum amplitude could change continuously. Correspondingly a direct adapting of the first reference value is advantageous. For directly adapting, the detection unit could analyze the first and/or second signal, in particular their signal amplitudes and/or the sum amplitude. Preferably the first reference value is coupled to the sum amplitude.

In one embodiment the adjusting unit comprises a switch unit. The switch unit could be an electronic switch, for example a field effect transistor or a bipolar transistor. With the switch unit, a predetermined basic reference value is assigned to the amplitude adapting unit as a first reference value. The switch unit can be multipolar in design. Corresponding to different results of the detection unit from the sum amplitude, a basic reference value from a plurality of basic reference values can be connected as a first reference value. The adjusting unit can comprise a control circuit preferably in connection with the detection unit, preferably a closed loop, by which a stepless adapting of the first reference value is possible. Inter alia, the adjusting unit can comprise sensing means with regards to the first bit stream.

The basic reference value can be fixed by a constant-voltage source. Further it would be conceivable to set the basic reference value depending on the sum amplitude, the first signal and/or the second signal.

In one embodiment the detection unit determines a voltage difference between the basic reference value and the sum amplitude. From the voltage difference, the detection unit recognizes whether the first and/or second signal is contained in the input signal. The detection unit can comprise a second comparator. The second comparator is preferably an operational amplifier. The basic reference value can be supplied to the second comparator as the second reference value. Ensuing from the voltage difference, the detection unit controls the switch unit. If, for example, the voltage difference is large, this means that the second signal is contained in the input signal. The switch unit is not actuated. In contrast, if the voltage difference is small, or preferably the sum amplitude smaller than the basic reference value, the switch unit is activated.

The first signal can be modulated on a first carrier frequency and the second signal on a second carrier frequency. The first signal and the second signal form a mixed signal. The mixed signal comprises the first signal, the second signal and a mixed product of the first signal and the second signal on an intermediate frequency. A second non-linear component demodulates the mixed product. A second amplitude adapting unit generates a second bit stream relating to the first signal from the signal course of the demodulated mixed product.

It can be provided that the mixed signal is tapped in the first non-linear component. The tapping point can match the baseband sum signal. Additionally, a separate tapping point could be configured for outputting the mixed signal at the first non-linear component. Alternatively a further non-linear component, preferably a mixer, can be provided.

A mixed amplitude is an amplitude in a mixed signal, which is formed by the first and second signal by mutual influencing.

Due to different carrier frequencies of the first carrier frequency and the second carrier frequency, the mixed signal is formed by the first non-linear component. The mixed signal contains mixed products of the first and second signal. The mixed products are on intermediate frequencies ($k \times f1 + m \times f2$) as well as $|k \times f1 - m \times f2|$ with k, m=0, 1, 2, 3, .... As a rule, the order of the intermediate frequency rises with the spacing of the intermediate frequencies from the carrier frequencies. That is, the first order holds for k+m=2. The first-order intermediate frequencies would be e.g. $2 \times f1$, $2 \times f2$, $1 \times f1 + 1 \times f2$ and $|f1-f2|$. The intermediate frequencies of the second order (k+m=3) holds, for example, for the intermediate frequencies $3 \times f1$, $3 \times f2$, $|1 \times f1 \pm 2 \times f2|$ und $|2 \times f1 \pm 1 \times f2|$. Integral multiples of sums and differences of the first and second carrier frequency are therefore possible as an intermediate frequency. Intermediate frequencies are similar to side bands; they are, however, also an integral multiple one of the carrier frequencies of the side bands. The intermediate frequency can be exactly one frequency. An intermediate frequency can also set a frequency spectrum or a frequency range in which the mixed product occurs. For example, the carrier frequency of the first and/or second signal can be within fixed limits. For example, the first and/or second signal is a signal with a possible carrier frequency in a frequency range of 880 MHz to 915 MHz. The mixed amplitude of the mixed products is substantially a product of the signal amplitudes of the first and second signal as well as of a constant factor. The course of the first signal is contained in the mixed product. In particular the course of an amplitude-modulated or frequency-modulated first signal is retained upon simultaneously receiving e.g. a phase-modulated second signal. A superimposition of the first and second carrier frequency is not contained in the mixed product. The amplitude of the mixed products decreases with rising order. Therefore mixed products of first order have the greatest amplitude. Each of the mixed products can be demodulated with the second demodulator, which is suitable for demodulating the first signal without influencing the second signal.

The second bit stream then corresponds to the signal course of the first signal, while the second signal is being received. For outputting the bit stream of the first signal, an output logic correspondingly changes from the first bit stream to the second bit stream. The second amplitude adapting unit can be constructed analogously or similar to the first amplitude adapting unit. The second amplitude adapting unit can comprise a unit, similar to the reference value adapting unit, to supply a second reference value to the second amplitude adapting unit.

The constant-voltage source can be configured as a separate voltage source. For example, the constant-voltage source can comprise a battery or an accumulator. Preferably the constant-voltage source is coupled with the input signal and generates a constant-output voltage from the input signal. The constant-voltage source can comprise a Zener diode, a voltage regulator, a charge pump and/or a potential divider. The constant-voltage source is preferably set to an output voltage which corresponds to the maximum signal amplitude of the first signal. The constant-voltage source can be wired so that the output voltage of the constant-voltage source is applied via an ohmic resistance to the amplitude adapting unit as a basic reference value.

BRIEF DESCRIPTION OF THE DRAWINGS

The invention will hereinafter be further explained by way of example with reference to the drawings. There are shown:

FIG. 6 a control diagram of the application example of FIG. 5a.

DETAILED DESCRIPTION OF VARIOUS EMBODIMENTS

Figure 1:
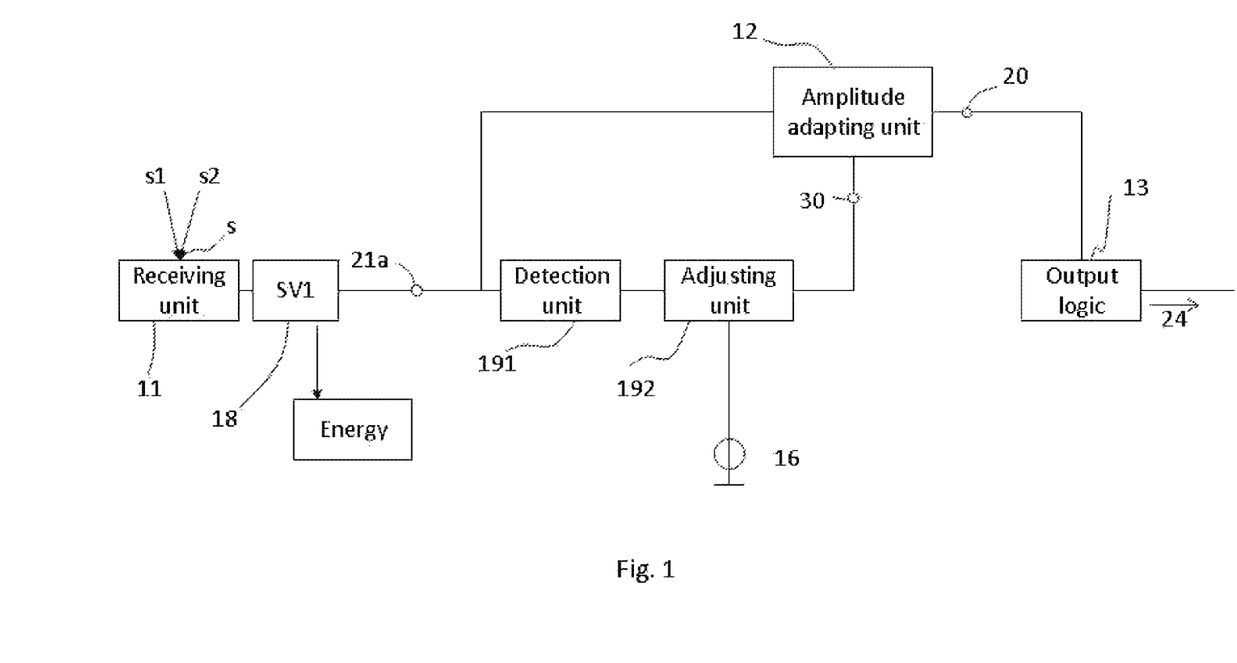
FIG. 1 a block diagram of an embodiment example according to the invention.

FIG. 1 shows a block diagram as to an embodiment according to the invention.

A receiving unit 11 receives an input signal s. The input signal s comprises a first signal s1 with a first signal amplitude and a second signal s2 with a second signal amplitude. In this embodiment example the first signal s1 is a UHF-RFID signal on the first carrier frequency f1 of approx. 865 MHz. The second signal s2 is a GSM signal on the second carrier frequency f2 of approx. 915 MHz. The input signal s is passed on by the receiving unit 11 to the first non-linear component 18, in the present case a voltage multiplier (SV) 18.

The voltage multiplier 18 is constructed like a charge pump and comprises an interconnection of diodes and capacitors. The first voltage multiplier 18 has the function of an electronic mixer due to its non-linear characteristic curve. The first voltage multiplier 18 produces a baseband sum signal 21a from the input signal s. The first voltage multiplier 18 demodulates the input signal s.

The baseband sum signal 21a is relayed to the first amplitude adapting unit 12. The first amplitude adapting unit 12 generates a first bit stream 20 from the baseband sum signal 21a on the basis of a first reference signal. For this purpose the first amplitude adapting unit 12 evaluates baseband sum signals 21a with respect to the first reference signal. The first amplitude adapting unit 12 compares preferably an amplitude of the baseband sum signal 21a with an amplitude of the first reference signal.

The first reference signal in this embodiment is generated exclusively by an adjusting unit 192. In particular the first reference signal is a direct-current voltage amplitude. The reference signal is dependent on the first and second signal s1, s2. The course of the amplitude-modulated signal s1 is contained in the baseband sum signal 21a. For generating the first reference value, the baseband sum signal 21a is converted to an as homogeneous as possible direct-current voltage signal with low fluctuations.

The first amplitude adapting unit 12 generates the first bit stream 20 starting out from amplitude changes in the baseband sum signal 21a with respect to the first reference signal. The first amplitude adapting unit 12 compares the amplitude of the baseband sum signal 21a with the amplitude of the first reference signal and outputs the first bit stream 20 correspondingly to a binary signal with a 1-signal or 0-signal.

Parallel to the first amplitude adapting unit 12, the baseband sum signal 21a is relayed to a reference value adapting unit 19. The reference value adapting unit 19 comprises a detection unit 191, the adjusting unit 192 and in this embodiment example a constant-voltage source 16. The detection unit 191 analyzes the baseband sum signal 21a. In particular the detection unit 191 recognizes whether, when and/or to what extent the second signal s2 is no longer received. Starting out from the result of the detection unit 191, the adjusting unit 192 controls the amplitude of the first reference signal. The adjusting unit 192 effectuates with the help of the constant-voltage source 16 that the first reference signal has a certain voltage amplitude. The first reference signal forms a first reference value of the first amplitude adapting unit 12. With the help of the adjusting unit 192 and the detection unit 191, the first reference value can be adjusted to a value to generate the first bit stream from the baseband sum signal 21a. The voltage amplitude of the constant-voltage source 16 therefore corresponds to a basic reference value for the amplitude adapting unit 12. In particular, it can be reacted quickly to changes in the baseband sum signal 21a, in particular to changes of the first and/or second signal s1, s2, e.g. when the first and second signal s1, s2 collectively discontinue.

Figure 2:
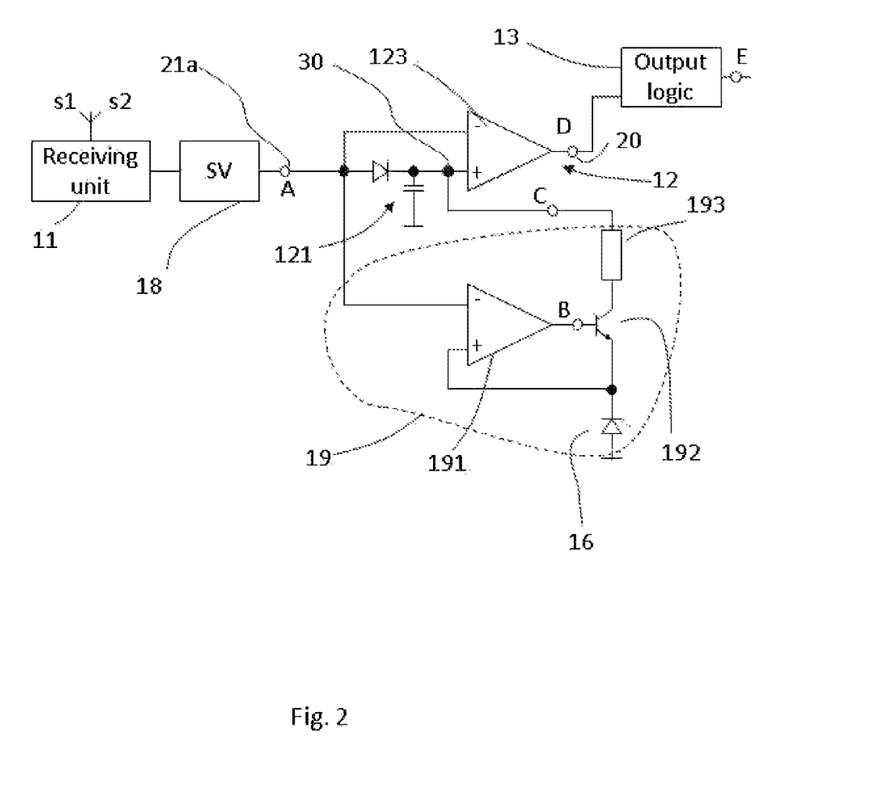
FIG. 2 a detailed representation of an embodiment example according to the invention.

In FIG. 2 a further embodiment example is shown by way of a circuit. More specifically, this example differs from FIG. 1 in the supplying of the reference value as well as in the degree of detail of the circuit.

A receiving unit 11 receives an input signal s which comprises a first and a second signal s1, s2. The input signal s is relayed to a non-linear component 18. In the present case the non-linear component 18 is a first voltage multiplier 18. The first voltage multiplier 18 increases the amplitudes in the input signal s. Simultaneously, the first voltage multiplier 18 has the function of a demodulator and mixer due to its non-linearity. The first voltage multiplier 18 creates a baseband sum signal 21a. The baseband sum signal 21a comprises the sum of the envelopes of the amounts of the first and second signals s1, s2. The baseband sum signal 21a is relayed to the first amplitude adapting unit 12, which comprises the first comparator 123 and a reference value generator 121. The baseband sum signal 21a is applied at an input of the first comparator 123.

Further the baseband sum signal 21a is fed to the reference value generator 121. The reference value generator 121 has a rectifier diode and a first capacitor. The reference value generator 121 delivers the first reference value to the first comparator 123. The first reference value corresponds substantially to the direct-current voltage portion in the baseband sum signal 21a minus the forward voltage of the rectifier diode. The reference value is additionally smoothed with the help of the capacitor. The first reference value is therefore lower than a peak value of the amplitude in the baseband sum signal 21a.

The reference value adapting unit 19 is connected substantially in parallel to the reference value generator 121. The reference value adapting unit 19 comprises a second comparator 191, an adjusting unit 192 in the form of an electronic switch 192, a load resistor 193 and a constant-voltage source 16. The baseband sum signal 21a is fed to an input (negative input) of the second comparator 191. The second input (positive input) of the second comparator 191 is connected to the constant-voltage source 16. The output of the second comparator 191 controls the electronic switch 192.

The electronic switch 192 can connect the positive input of the first comparator 123, which accepts the reference value to the constant-voltage source 16. The electronic switch 192 enables that the potential of the constant-voltage source 16 is fed to the first comparator 123 as a first reference value.

Preferably the potential of the constant-voltage source 16 corresponds to 0.4-0.6 V. The reference value generator 121 produces the generated reference value, which depends on the baseband sum signal 21a, i.e. from the first and second signal s1, s2. If only one signal is received, the first reference value is lower than if the first and second signal s1, s2 are received. Due to the capacitor of the reference value generator 121, the peak amplitudes are smoothed. An rise of the amplitude in the baseband sum signal 21a is quickly taken into account. After the first and second signal s1, s2 were received from the receiving unit 11, a discontinuation of a signal in the baseband sum signal 21a causes a delayed reaction through discharging the capacitor. In order to discharge the capacitor as quickly as possible while maintaining a certain potential for the first reference value, the electronic switch 192 is connected upon discontinuation of a signal, preferably the second signal s2. The voltage potential of the constant-voltage source 16 is led to the reference value generator 121. The capacitor of the reference value generator 121 will be discharged via the constant-voltage source 16 substantially to the potential thereof. The voltage potential of the constant-voltage source 16 is supplied as a first reference value to the first comparator 123.

The first comparator 123 can quickly react to changes of the input signal s, in particular upon a discontinuation of the second signal s2. Immediately after the discontinuation of the first or second signal s1, s2 from the input signal s, the first comparator 123 can generate a first bit stream 20 and can supply the first bit stream 20 to an output logic 13 for outputting a bit stream of the first signal s1 as an output bit stream.

Figure 3:
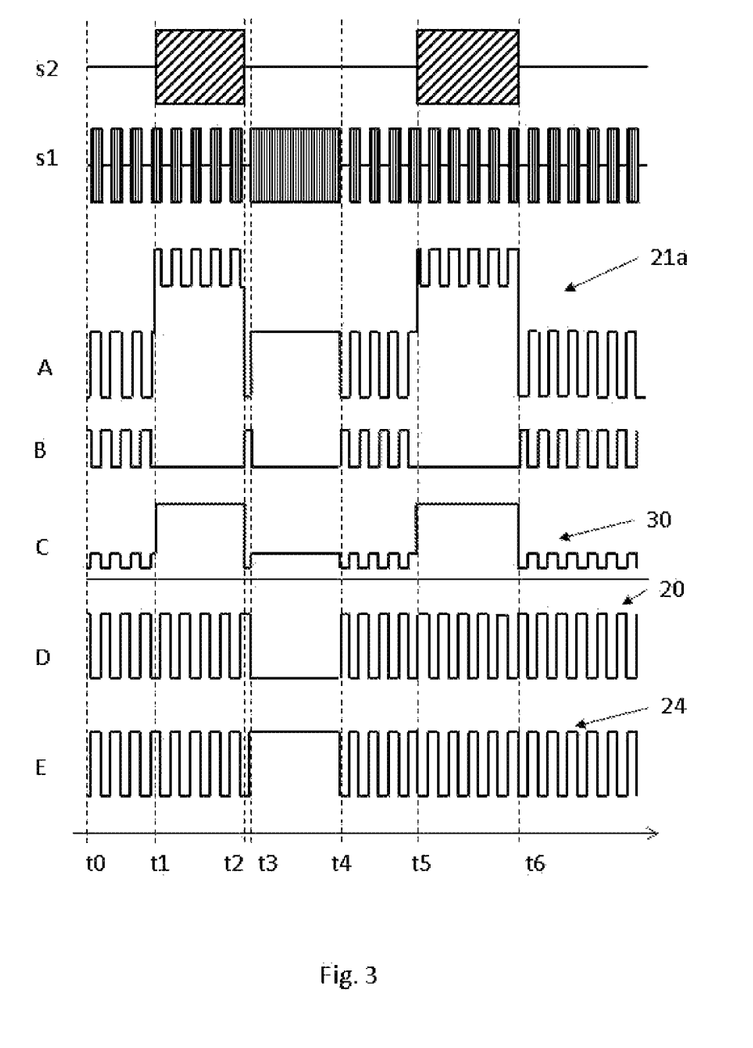
FIG. 3 a schematic frequency diagram of the circuit of FIG. 2.

FIG. 3 shows signal courses at measurement points A to E of FIG. 2 in the time ranges t0 to t6. Hereinafter the operating situations will be described according to the time range t0 to t6 with respect to the FIGS. 2 and 3.

In the time interval t0 to t1, the input unit 11 receives only the first signal s1. The input signal s contains only the first signal s1. The first voltage multiplier (SV) 18 increases the amplitude of the input signal s and demodulates the input signal s. The baseband sum signal 21a at the output of the first voltage multiplier 18 contains merely the increased, demodulated input signal s (cf. measurement point A). The reference value generator 121 obtains the baseband sum signal 21a and generates a first reference value from the baseband sum signal 21a. The first reference value would correspond substantially to the direct-current voltage portion in the baseband sum signal 21a.

The baseband sum signal 21a is moreover applied at the negative input of the second comparator 191 of the reference value adapting unit 19. The potential of the constant-voltage source 16 is applied at the positive input of the second comparator 191. The second comparator 191 outputs a 1-signal if the signal course of the baseband sum signal 21a and therefore the first signal s1 traverses a valley (cf. measurement point B). The second comparator 191 correspondingly switches the electronic switch 192, whereby the potential of the first generated reference value of the reference value generator 121 is matched with the voltage potential of the constant-voltage source 16. In other words, upon exceeding of the voltage potential of the constant-voltage source 16, the voltage potential of the capacitor of the reference value generator 121 is quickly adjusted via the load resistor 193 with the potential of the constant-voltage source 16 (cf. measurement point C) if the first signal traverses a valley. The capacitor is at least partly discharged. The first comparator 123 is correspondingly supplied the voltage potential of the constant-voltage source 16 at the positive input as a first reference value. Therefore, the first reference value corresponds to the course of the demodulated first signal s1 in the time interval [t0; t1], i.e. to the baseband sum signal 21a, with a DC offset (direct-current voltage offset).

The baseband sum signal 21a is likewise applied at the negative input of the first comparator 123. A valley traversal (0-amplitude) in the baseband sum signal 21a yields a 1-signal in the first bit stream 20 (cf. measurement point D) by reference to the reference value by the amplitude adapting unit. The first comparator 123 outputs the first bit stream 20. The output logic 13 creates the bit stream of the first signal s1 (cf. measurement point E) from the first bit stream 20.

In the time interval [t1; t2] the security module receives the first as well as the second signal s2. The first voltage multiplier 18 generates a baseband sum signal 21a from the input signal s. The amplitude of the baseband sum signal 21a is significantly higher than in the time interval [t0; t1] (cf. measurement points A). In particular, the signal course of the baseband sum signal 21a corresponds to the course or the baseband of the first signal and comprises a voltage offset proportional to the amplitude of the second signal s2.

As already set forth above, the reference value generator 121 generates the first reference value from the baseband sum signal 21a for the positive input of the comparator 123. The first reference value in this time interval is higher than in the time interval [t0; t1]. The amplitude of a valley traversal in the baseband sum signal 21a is higher than the voltage potential of the constant-voltage source 16. The second comparator 191 delivers a 0-signal (cf. measurement point B) at its output. The first electronic switch 192 does not switch. At the positive input of the first comparator 123, the first reference is therefore applied as a relevant reference value (cf. measurement point C). The first comparator 123 generates the first bit stream 20 from the baseband sum signal 21a with respect to the first reference value (cf. measurement point D). The first bit stream 20 is fed to the output logic 13. The output logic 13 outputs the bit stream of the first signal s1 (cf. measurement point E).

In the time interval t0 to t2, the receiving unit 11 has received a modulated first signal s1. During the time interval [t2–t3] the receiving unit 11 receives neither the first signal s1 nor the second signal s2. The baseband sum signal 21a is applied at the output of the first voltage multiplier 18 without first and second signal s1, s2, i.e. the baseband sum signal 21a has a 0-level. The first reference value generator 121 maintains the first reference value for the first comparator 123 for the time being. The second comparator 191 compares the baseband-sum signal 21a with the amplitude of the constant-voltage source 16. The second comparator 191 correspondingly outputs a 1-signal (cf. measurement point B) and switches the electronic switch 193. The capacitor of the reference value generator 121 is discharged via the electronic switch 193 and the constant-voltage source 16 to their amplitude or voltage potential. The first reference value corresponds to the amplitude of the constant-voltage source 16, which is higher than the amplitude of the baseband sum signal 21a. The first comparator 123 outputs a 1-signal (cf. measurement point D). Correspondingly, the output logic 13 outputs a 0-signal (cf. measurement point E). For the time interval [t2; t3] the signal of the output logic 13 corresponds to the demodulated signal course of the first signal s1.

In the time interval [t3; t4] the receiving unit receives a first signal s1, which is unmodulated to 100% as to an amplitude modulation. Further, no second signal s2 of a 915 MHz carrier frequency is received.

The reference value generator 121 generates the first reference value on the basis of the baseband sum signal 21a. The baseband sum signal 21a has no valleys (cf. measurement point A). The first reference value corresponds to the first reference value, which was generated during the peak amplitudes in the baseband sum signal 21a in the time interval [t1; t2]. Substantially the first reference value corresponds to the amplitude of the first signal s1 minus the forward voltage of the rectifier diode of the reference value generator 121. The amplitude of the baseband sum signal 21a is higher than the amplitude of the constant-voltage source 16. The second comparator 191 outputs a 0-signal (cf. measurement point B). The electronic switch 192 does not switch. At the positive input of the first comparator 123 of the reference value adapting unit 12, the first reference value is applied (cf. the measurement point C), which is supplied by the reference value generator 121. The first comparator 123 delivers a permanent 0-signal or low-signal (cf. measurement point D) at its output as the first bit stream 20. The output logic 13 generates the bit stream of the first signal s1 (cf. measurement point E) from the first bit stream 20.

In the time interval [t4; t5], the receiving unit 11 again receives a 100% amplitude-modulated first signal s1. Further, no second signal s2 is received. The bit stream of the first signal s1 is generated at the output of the output logic 13 analogously to the time interval [t0; t1]. With every valley traversal in the baseband sum signal 21a, the second comparator 191 outputs a 1-signal (cf. measurement point B). The electronic switch 192 switches. The smoothing capacitor of the reference value generator 121 is discharged to the voltage potential of the constant-voltage source 16. The first reference value is set to the voltage potential of the constant-voltage source 16.

In the time interval [t5; t6] the bit stream of the first signal s1 is generated analogously to the time interval [t1; t2].

As can be recognized from the embodiment example as set forth, the reference value adapting unit 19 acts only if the amplitude of the mixed signal is smaller than the voltage amplitude of the constant-voltage source 16. That is, the reference value adapting unit 19 influences the reference value generator 121 only if the first signal s1 as well as the second signal s2 are not received by the receiving unit 11. In this case the smoothing capacitor of the reference value generator 121 is discharged to a potential pre-specified by the reference value adapting unit 19, in particular the constant-voltage source 16.

Figure 4:
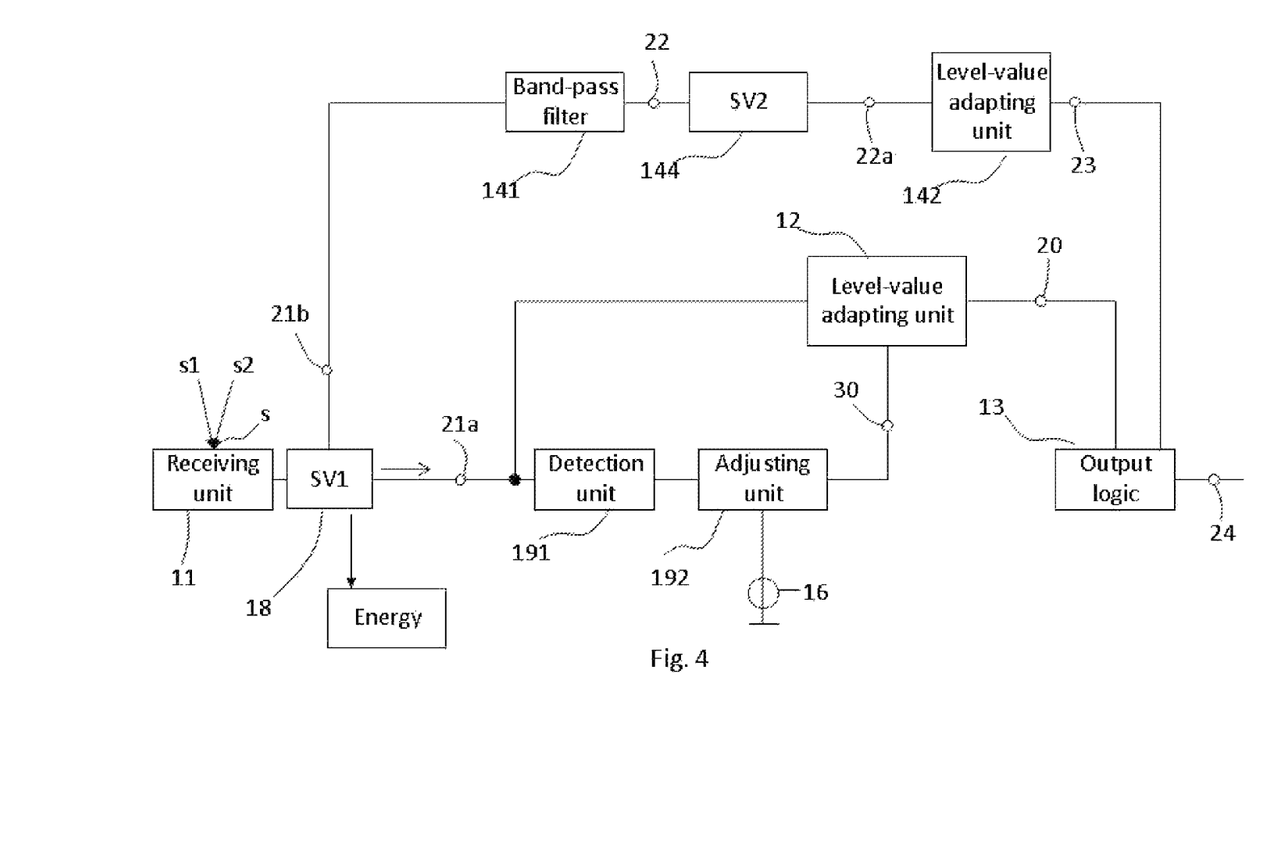
FIG. 4 an extension of the circuit of FIG. 2.

FIG. 4 shows an extension of the embodiment examples shown in FIG. 2. In detail, a band-pass filter 141, a second non-linear component 144 in the form of the second voltage multiplier 144 and the second amplitude adapting unit 142 are added. In the present case the property of the first voltage multiplier 18 of an electronic mixer is utilized so that a mixed signal 21b is fed from the first voltage multiplier 18 to the band-pass filter 141. Preferably the mixed signal 21b differs from the baseband sum signal 21a. The band-pass filter 141 filters a mixed product signal 22 from the mixed signal 21b. The mixed product signal 22 is fed to the second voltage multiplier 144. The second voltage multiplier 144 demodulates the mixed product signal 22, increases its amplitude and outputs a baseband signal 22a. The baseband signal 22a is fed to the second amplitude adapting unit 142. The second amplitude adapting unit 142 generates a second bit stream 23 from the baseband signal 22a. The first bit stream 23 is fed to the output logic 13. The output logic 13 generates the bit stream of the first signal s1 from the first bit stream 20 and the second bit stream 23. In particular, the output logic 13 changes upon applying the second bit stream 23 to the output of the second bit stream 23 as bit stream of the first signal s1. That is, the output logic outputs the second bit stream 23 only if a signal is applied at the second bit stream 23.

With the help of the first non-linear component 18 (first voltage multiplier 18), a baseband sum signal 21a and a mixed signal 21b are generated when receiving the first and second signal. If the second signal s2 is received while no signal level of the first signal s1 is applied, the first amplitude adapting unit 12 can generate a bit error in the first bit stream 20. The rise of the amplitude of the baseband sum signal 21a could be rated by the reception of the second signal s2 from the first amplitude adapting unit 12 as a 1-signal of the demodulated first signal s1. To exclude this bit error, the mixed product signal 22 is filtered from the mixed signal 21b by the band-pass filter 141. The mixed product signal 22 is cleaned as to other spurious mixed products and signals. The first signal s1 is present in amplitude-modulated form. The second signal s2 is not present in amplitude-modulated form. The mixed product signal 22 is demodulated by the second voltage multiplier 144 as to the first signal s1. The second voltage multiplier 144 outputs the baseband signal 22a. The baseband signal 22a comprises the demodulated first signal s1. The second amplitude adapting unit 142 generates the second bit stream 23 with respect to a second reference value. The second reference value can be generated from the baseband signal 22a, similar to the reference value generator 121. Moreover, the second reference value could be generated analogously to the first reference value with the help of the reference value adapting unit or a similar unit.

The output logic 13 recognizes whether a second bit stream 23 is generated and correspondingly switches to the second bit stream 23 for outputting the bit stream of the first signal s1. Preferably the first bit stream 20 is negated upon outputting said bit stream and is outputted as bit stream of the first signal s1. The output bit stream of the output logic 13 corresponds to the bit stream of the first signal s1.

Figure 5A:
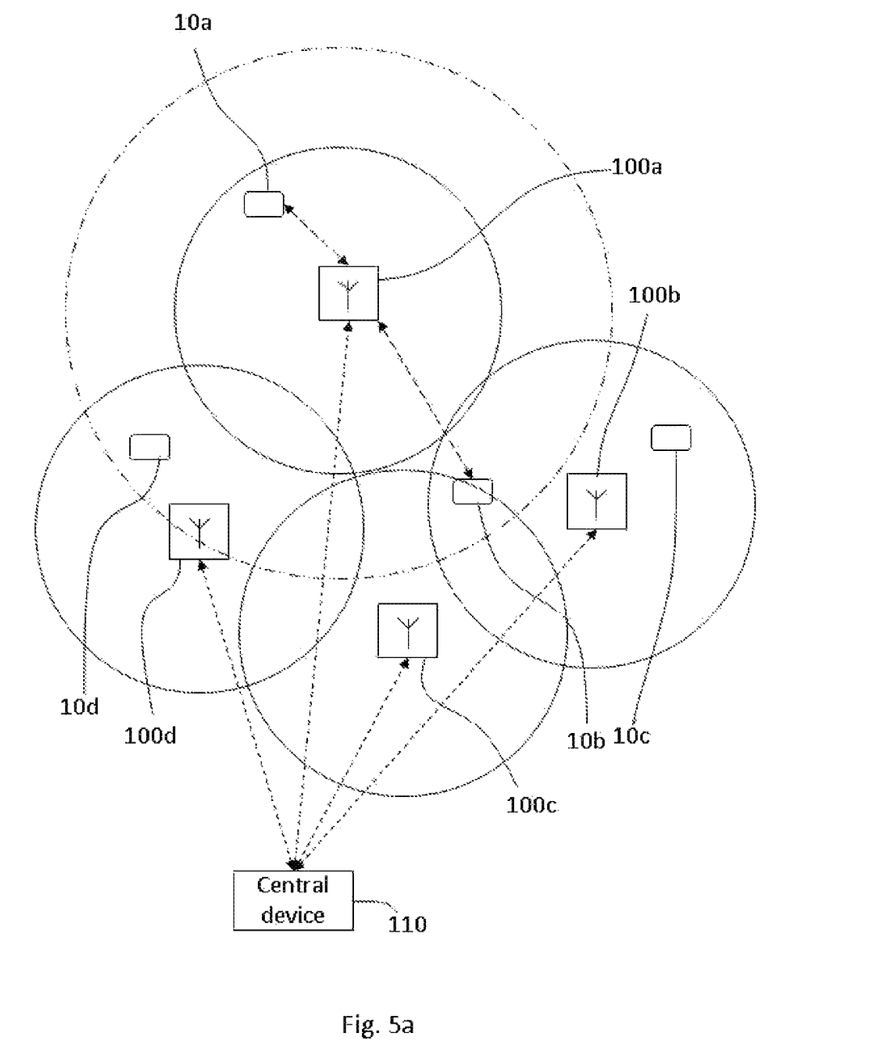
FIG. 5a an application example for the use of the invention for increasing the ranges of security modules.

FIG. 5a shows an embodiment example of an application of the invention in UHF-RFID labels and tags to the increase in range.

Several UHF-RFID transmitters 100a, 100b, 100c, 100d can respectively receive responses from UHF-RFID labels 10a, 10b, 10c, 10d in a certain vicinity (circles with continuous line around UHF-RFID transmitter 100a, 100b, 100c, 100d). The UHF-RFID labels 10a, 10b, 10c, 10d are equipped according to the invention. For the communication between the UHF-RFID transmitters 100a, 100b, 100c, 100d and the UHF-RFID labels 10a, 10b, 10c, 10d, the UHF-RFID labels 10a, 10b, 10c, 10d operate in the electromagnetic far-field, i.e. they transmit responses by means of modulated backscatter. The UHF-RFID labels 10a, 10b, 10c, 10d have no dedicated energy supply. Their range therefore depends on the electromagnetic far-field. The first UHF-RFID label 10a can communicate with the first UHF-RFID transmitter 100a in the field of said transmitter. However, a communication of the first UHF-RFID label 10a with the second/third/fourth UHF-RFID transmitter 10b, 10c, 10d is in principle not possible. The second UHF-RFID label 10b is in the communication range of the second and third UHF-RFID transmitter 100b, 100c and can communicate with these. The fourth UHF-RFID label 10d is merely in the communication range with the fourth UHF-RFID transmitter 100d. In order for the second UHF-RFID label 10b to be able to communicate with the first UHF-RFID transmitter 100a, more energy must be supplied to the second UHF-RFID label 10b. For this purpose the second UHF-RFID label 10b can draw energy from the electromagnetic fields of the second and third UHF-RFID transmitters 100b, 100c.

The second and third UHF-RFID transmitter 100b, 100c respectively transmit a non-modulated second and third signal s2, s3 respectively on a second or third carrier frequency f2, f3. The first UHF-RFID transmitter 100a transmits a request to the second UHF-RFID label 10b as a modulated first signal s1 on a first carrier frequency f1. In principle the first, second and third carrier frequency lie in the identical frequency band and f1≠f2; f1≠f3; f1≈f2; f1≈f3. The modulated first signal s1 as well as the unmodulated signals s2, s3 are received by the second UHF-RFID label 10b. Due to the additional second and third signals s2, s3, which superimpose the first signal s1, mixed products are formed in the second UHF-RFID label 10b. The mixed products can be utilized for further signal processing by the second UHF-RFID label 10. The energy content of the first, second and third signal s1, s2, s3 is in sum available to second UHF-RFID label 10b. The second UHF-RFID label 10b receives the first, second and third signal s1, s2, s3 and generates a bit stream of the first signal s1 with the help of the invention. The second UHF-RFID label 10b creates a first response.

Due to the plural signals, namely of the first, second and third signal s1, s2, s3, the second UHF-RFID label 10b obtains a higher energy for operating, in comparison to merely a single first signal s1. The return transmission range is in principle not increased. Due to the energy of the first UHF-RFID transmitter 100a, this is sufficient to evaluate the return transmission signal or the first response. If the second UHF-RFID label 10b is located outside of the energy range of the first UHF-RFID transmitter 100a, however within its communication range, the second UHF-RFID label 100b can be subjected to sufficient energy by additional energy input of the second UHF-RFID transmitter 100b to communicate with the first UHF-RFID transmitter 100a. Due to the additional energy supply of the second UHF-RFID label 10b, it can evaluate signals of smaller amplitude. The distance between the first UHF-RFID transmitter 100a and second UHF-RFID label 10b can be enlarged (see dash-double-pointed line around first UHF-RFID transmitter 100a). The same holds for the fourth UHF-RFID label 10d in connection using the fourth UHF-RFID transmitter 100d for communicating with the first UHF-RFID transmitter 100a.

The energy range is the range of an UHF-RFID transmitter within which an UHF-RFID label with enough energy can be supplied for its operation. The communication range is the range of an UHF-RFID label within which an UHF-RFID label with an UHF-RFID transmitter could communicate, provided that the UHF-RFID label obtains enough energy for operating the UHF-RFID label. As a rule the energy range is smaller than the communication range.

The electromagnetic far-field of the second UHF-RFID transmitter 100b reaches the third UHF-RFID label 10c.

However, the communication range of the first UHF-RFID transmitter 100a cannot be increased sufficiently so that the third UHF-RFID label 10c can respond to the first UHF-RFID transmitter 100a.

In FIG. 5a the communication is shown merely by way of example starting out at the first UHF-RFID transmitter 100a. The communication can correspondingly be transferred to another UHF-RFID transmitter, e.g. the second, third and/or fourth UHF-RFID transmitter 100b, 100c, 100d.

In principle is to be noticed that only one UHF-RFID transmitter transmits a valid communication signal, i.e. a modulated UHF-RFID signal. Other transmitters, e.g. the second, third and fourth UHF-RFID transmitter 100b, 100c, 100d, preferably transmit an unmodulated signal. Due to unmodulated signals, merely additional energy is supplied to the UHF-RFID label. With the help of the invention, the UHF-RFID label can generate from the superimposed signals a bit stream corresponding to the modulated signal. Should two UHF-RFID transmitters simultaneously transmit modulated signals recognizable by the UHF-RFID label, the UHF-RFID label could not generate a bit stream from the superimposition of the two modulated signals.

Figure 5B:
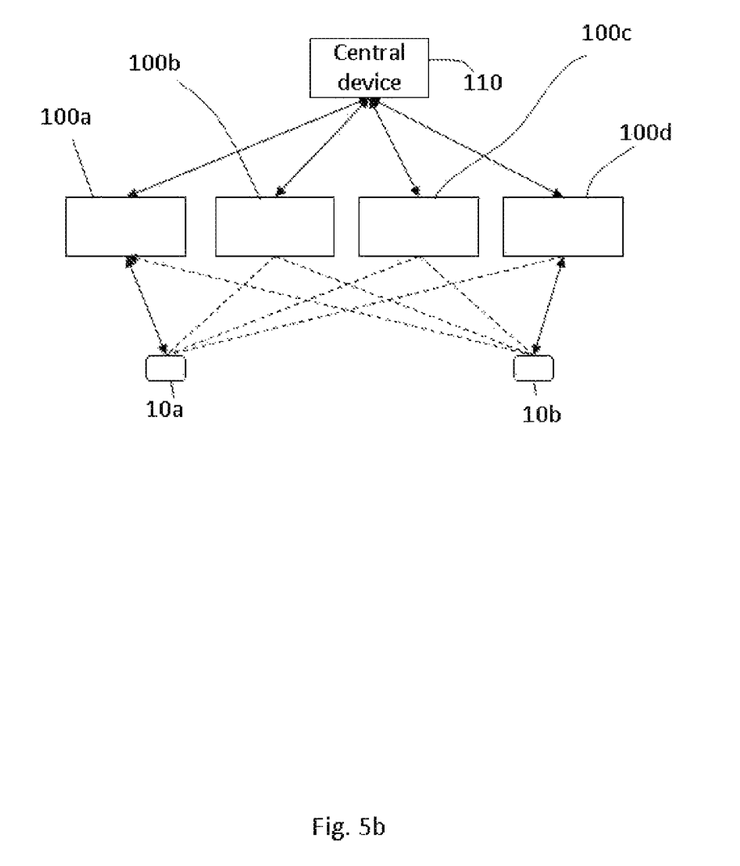
FIG. 5b an embodiment example for controlling the increase in range.

FIG. 5b shows an embodiment example of a control for the increase in range according to FIG. 5a. A central device 110 controls the UHF-RFID transmitters 100a, 100b, 100c, 100d. The central device 110 sets which UHF-RFID transmitter 100a, 100b, 100c, 100d may communicate with the first and/or second RFID label 10a, 10b (only first and second RFID label 10a, 10b shown in FIG. 4b). In particular the central device 110 sets which UHF-RFID transmitter 100a, 100b, 100c, 100d transmits a first signal demodulatable by the first and/or second RFID label 10a, 10b, and which of the UHF-RFID transmitters 100a, 100b, 100c, 100d transmit an unmodulated signal or a signal not demodulatable by the first and/or second UHF-RFID label. Thus the first UHF-RFID transmitter 100a transmits a signal demodulatable by the first RFID label 10a, whereas the second, third and fourth UHF-RFID transmitter 100b, 100c, 100d respectively transmits a signal unmodulated for the first RFID label 10a. Therefore the communication range between the first UHF-RFID transmitter 100a and the first RFID label 10a can be enlarged. Analogously, the fourth UHF-RFID transmitter 100d transmits a signal demodulatable by the second RFID label 10b, whereas the first, second and third UHF-RFID transmitter 100a, 100b, 100c respectively transmit a signal unmodulated for the second RFID label 10b. Therefore the communication range between the fourth UHF-RFID transmitter 100d and the second RFID label 10b can be enlarged. The system is, however, configured such that either the first and fourth UHF-RFID transmitters 100a, 100d do not transmit simultaneously, or the first and fourth UHF-RFID transmitter 100a, 100d respectively transmit a signal with a different kind of modulation.

Preferably the central device 110 instructs one UHF-RFID transmitter 100a, 100b, 100c, 100d in a targeted manner. Alternatively, several of the first, second, third and/or fourth UHF-RFID transmitters 100a, 100b, 100c, 100d can also be instructed for communicating with the first and/or second UHF-RFID label 10a, 10b, wherein the first, second, third and/or fourth UHF-RFID transmitter 100a, 100b, 100c, 100d does not simultaneously transmit a modulated signal relating to the first and/or second UHF-RFID label 10a, 10b.

In addition to the communication, a spatial localization of the first and/or second UHF-RFID labels 10a, 10b can be performed by analyzing the signals with regard to the carrier frequencies. Aside from the control of the UHF-RFID transmitters, the central device 110 can adopt the function of a central communication place, e.g. distribution center for all messages.

Figure 6:
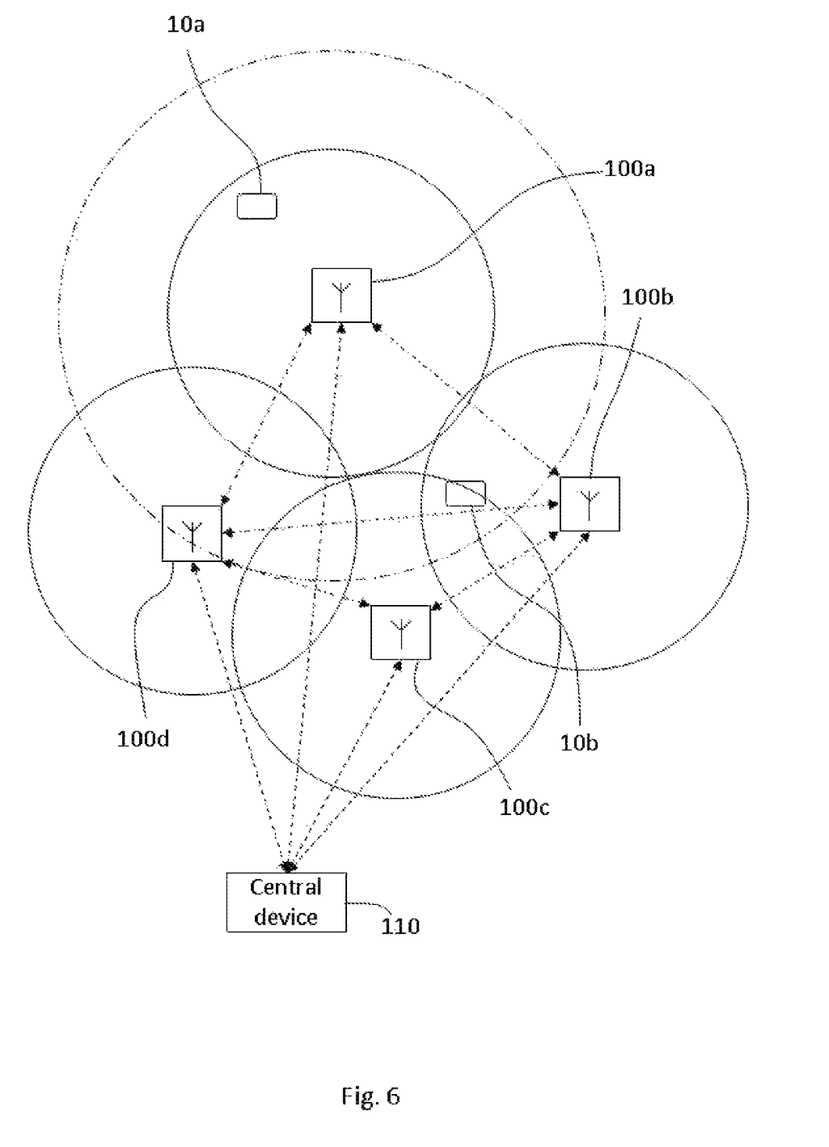

In FIG. 6 a further application example of the invention is represented. The spatial construction is similar to FIG. 5a. Instead of the communication between an UHF-RFID transmitter 100a, 100b, 100c, 100d and one of the UHF-RFID labels 10a, 10b, 10c, 10d, a communication among the UHF-RFID transmitters 100a, 100b, 100c, 100d is viewed in this Figure.

For communicating between UHF-RFID transmitter 100a, 100b, 100c, 100d and UHF-RFID label 10a, 10b, 10c, the first UHF-RFID transmitter 100a transmits a modulated signal. The second, third and fourth UHF-RFID transmitter 100b, 100c, 100d transmit an unmodulated signal. Instead of an unmodulated signal, the second, third and fourth UHF-RFID transmitter 100b, 100c, 100d can transmit a signal which is not demodulatable by the first, second and third UHF-RFID label 10a, 10b, 10c. Therefore such a signal appears likewise as a spurious signal or as an unmodulated signal to the first, second and third UHF-RFID label 10a, 10b, 10c. The fact that a signal is not demodulatable does not induce that it is unmodulated to 100% on the carrier frequency. Rather, the signal can have data which is modulated on a carrier frequency with a modulation method or encoding method unknown to the UHF-RFID label. While, for example, data is transferred between the first, second, third and fourth UHF-RFID transmitter 100a, 100b, 100c, 100d and the first, second and third UHF-RFID label 10a, 10b, 10c by means of ASK modulation, the first, second, third and/or fourth UHF-RFID transmitter 100a, 100b, 100c, 100d can transmit a signal with FSK modulation. This signal would not be demodulatable for the first, second or third UHF-RFID label 10a, 10b, 10c. The first, second, third and/or fourth UHF-RFID transmitter could be configured for demodulating a signal modulated with FSK modulation. A data exchange (dotted/dashed line) between the UHF-RFID transmitters 100a, 100b, 100c, 100d can take place using an FSK modulation. Data by means of FSK modulation are not demodulatable for the UHF-RFID labels 10a, 10b, 10c, 10d. In this way it can be ensured that the communication between the UHF-RFID transmitters 100a, 100b, 100c, 100d is not processed by the UHF-RFID labels 10a, 10b, 10c, 10d. The UHF-RFID transmitters 100a, 100b, 100c, 100d can transmit, for example, control signals among each other, for example for a standby function or a change of the carrier frequency. A central device 110 monitors and controls additionally the UHF-RFID transmitters 100a, 100b, 100c, 100d (dashed line).

The description and the figures indicate that the invention contributes to the improved interference immunity of a UHF-RFID device. Spurious signals which are received in the same frequency band as the desired data signal can be filtered out easily, cost-efficiently and in a small design. Moreover, the invention can increase the range of UHF-RFID tags. Further a communication can take place between UHF-RFID transmitters.

The invention claimed is:

1. A method for adapting a first reference value for generating a first bit stream from an input signal by a first amplitude adapting unit, wherein the input signal comprises a first and a second signal, the first signal and the second signal form a baseband sum signal, a first non-linear component demodulates the input signal and outputs a demodulated input signal, and the amplitude adapting unit outputs the first bit stream from the demodulated input signal on the basis of a first reference value, wherein a reference-value adapting unit comprises a detection unit, which detects the first and the second signal, and upon discontinuation of the first and the second signal, an adjusting unit adjusts the first reference value to a basic reference value.

2. The method according to claim 1, wherein the first signal has a first signal amplitude and the second signal a second signal amplitude, the first and second signal amplitudes form a sum amplitude of the baseband sum signal, and the first reference value follows the course of the sum amplitude.

3. The method according to claim 1, wherein the adjusting unit matches the first reference value to the basic reference value by means of a switch unit.

4. The method according to claim 1, wherein a constant-voltage source, as a stabilized constant-voltage source, supplies the basic reference value.

5. The method according to claim 1, wherein the first reference value is coupled to the sum amplitude.

6. The method according to claim 1, wherein the basic reference value is supplied to the detection unit for detecting the second signal.

7. The method according to claim 1, wherein the detection unit determines a voltage difference between the basic reference value and the sum amplitude.

8. The method according claim 1, wherein the first signal is modulated on a first carrier frequency and the second signal on a second carrier frequency, wherein the first and second signal form a mixed signal and the mixed signal comprises the first signal, the second signal and a mixed product of the first signal and the second signal on an intermediate frequency, wherein a second non-linear component demodulates the mixed product and a second amplitude value adapting unit generates from the demodulated mixed product a second bit stream relating to the first signal.

9. The method according to claim 8, wherein the first bit stream at the output of the first amplitude value adapting unit and/or the second bit stream of the second amplitude value adapting unit are fed to an output logic.

10. The method according to claim 1, wherein the detection unit detects an edge of the first and/or second signal.

11. A circuit for adapting a first reference value for generating a first bit stream from an input signal, wherein the input signal comprises a first signal and a second signal, the first signal has a first signal amplitude and the second signal a second signal amplitude, and the first signal amplitude forms a sum amplitude with the second signal amplitude, the circuit comprises a first non-linear component and a first amplitude value adapting unit, the first non-linear component is configured to demodulate the input signal and to output a demodulated input signal, and the first amplitude value adapting unit is configured to generate the first bit stream from the demodulated input signal on the basis of a first reference value, wherein the circuit comprises a detection unit and an adjusting unit, wherein the detection unit is configured to ascertain whether the first signal and the second signal are present in the input signal, and the adjusting unit is configured to adapt the first reference value to a basic reference value if the first signal and the second signal are discontinued.

12. The circuit according to claim 11, wherein the circuit is used in a security module, as in an UHF-RFID module.

13. The circuit according to claim 11, wherein the adjusting unit comprises a switch, as in an electronic switch, wherein the adjusting unit is configured to couple a voltage level of the first reference value to the voltage level of the basic reference value.

14. The circuit according to claim 11, wherein the circuit has a constant-voltage source, as in a stabilized constant-voltage source, wherein the constant-voltage source is configured to supply the basic reference value.

15. The circuit according to claim 11, wherein the circuit has an output logic, wherein a first input of the output logic is coupled with the first bit stream and the output logic is configured to generate a bit stream of the first signal.

16. The circuit according to claim 11, wherein the circuit comprises a frequency filter, as in a band-pass filter, a second non-linear component and a second amplitude value adapting unit, wherein the frequency filter is connected downstream of the first non-linear component, the first non-linear component outputs a mixed product and the frequency filter outputs a mixed product of the first and second signal, on an intermediate frequency, and the second non-linear component to demodulate the mixed product, and the second amplitude value adapting unit is configured to generate a second bit stream, and a second input of the output logic is coupled with the second bit stream.

* * * * *